(12) United States Patent
Alcoe et al.

(10) Patent No.: US 6,887,779 B2
(45) Date of Patent: May 3, 2005

(54) INTEGRATED CIRCUIT STRUCTURE

(75) Inventors: David J. Alcoe, Vestal, NY (US); Francis J. Downes, Jr., Vestal, NY (US); Gerald W. Jones, Apalachin, NY (US); John S. Kresge, Binghamton, NY (US); Cheryl L. Tytran-Palomaki, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 49 days.

(21) Appl. No.: 10/719,495

(22) Filed: Nov. 21, 2003

(65) Prior Publication Data

US 2004/0099939 A1 May 27, 2004

Related U.S. Application Data

(62) Division of application No. 09/571,611, filed on May 15, 2000, now Pat. No. 6,720,502.

(51) Int. Cl.⁷ .......................................... H01L 21/4763
(52) U.S. Cl. ...................... 438/620; 438/622; 438/637; 438/639
(58) Field of Search ............................... 438/599, 610, 438/618, 623, 637, 666, 667, 675

(56) References Cited

U.S. PATENT DOCUMENTS

| | | | |
|---|---|---|---|
| 4,710,854 A | * 12/1987 | Yamada et al. | 361/794 |
| 5,072,075 A | 12/1991 | Lee et al. | |
| 5,121,190 A | 6/1992 | Hsiao et al. | |
| 5,487,218 A | 1/1996 | Bhatt et al. | |
| 5,557,844 A | * 9/1996 | Bhatt et al. | 29/852 |
| 5,574,630 A | * 11/1996 | Kresge et al. | 361/792 |
| 5,615,087 A | 3/1997 | Wieloch | |
| 5,792,705 A | 8/1998 | Wang et al. | |
| 5,798,563 A | 8/1998 | Feilchenfeld et al. | |
| 5,876,842 A | 3/1999 | Duffy et al. | |
| 5,894,173 A | 4/1999 | Jacobs et al. | |
| 5,900,675 A | 5/1999 | Appelt et al. | |
| 5,906,042 A | 5/1999 | Lan et al. | |
| 5,929,729 A | * 7/1999 | Swarup | 333/246 |
| 6,000,130 A | * 12/1999 | Chang et al. | 29/852 |
| 6,388,208 B1 | * 5/2002 | Kiani et al. | 174/266 |

OTHER PUBLICATIONS

"High Performance Carrier Technology: Materials And Fabrication", by Light et al, 1993 International Electronics Packaging Conference, San Diego, California, vol. One.

"High Performance Carrier Technology", by Heck et al, 1993 International Electronics Packaging Conference, San Diego, California, vol. One.

"Process Considerations in the Fabrication of Teflon Printed Circuit Boards", by Light et al, 1994 Proceedings, 44 Electronic Components & Technology Conference, May 1994.

* cited by examiner

*Primary Examiner*—Carl Whitehead, Jr.
*Assistant Examiner*—David L. Hogans
(74) *Attorney, Agent, or Firm*—Schmeiser, Olsen & Watts; William H. Steinberg

(57) ABSTRACT

A semiconductor chip carrier having an increased chip connector and plated through hole density. In particular, a substrate having a plurality of plated through holes therein, and a fatigue resistant redistribution layer thereon. The redistribution layer includes a plurality of vias selectively positioned over and contacting the plated through holes. The substrate further including a ground plane, two pair of signal planes, and two pair of power planes, wherein the second pair of power planes are located directly underneath the external dielectric layer. A buried plated through hole within the substrate.

20 Claims, 4 Drawing Sheets

INTEGRATED CIRCUIT STRUCTURE

This application is a divisional of Ser. No. 09/571,611; filed on May 15, 2000, now U.S. Pat. No. 6,720,502.

BACKGROUND OF THE INVENTION

1. Technical Field

The present invention relates generally to electronic packaging, and more particularly, to an organic semiconductor chip carrier and method of forming the same.

2. Related Art

As the demand grows in the industry for miniaturized high performance semiconductor packages, the need to manufacture a reliable device having high density connections becomes increasingly important. In other words, producing a device having the largest number of chip connections over the smallest possible area is one of the primary objectives. It is also important to produce a structure capable of providing adequate "wireout" capabilities to take advantage of the high density connections.

FIG. 1 shows a cross-sectional view of a related art semiconductor chip carrier 10. The carrier 10 includes a ground plane 12, a first dielectric layer 14 on each side of the ground plane 12, a signal layer 16 over each first dielectric layer 14, a second dielectric layer 18 over each signal layer 16, a power core 20 over each second dielectric layer 18, and a third dielectric layer 22 over each power core 20. The carrier 10 has a plurality of copper plated through holes 24, wherein the copper plating forms a "dogbone" connection pad 28 on the surface of the carrier 10. A redistribution layer 30 covers the surface of the carrier 10. The redistribution layer 30 contains contact areas 34, which facilitate electrical connection of semiconductor chips (not shown), through interconnections (also not shown), to the dogbone connection pads 28 of the plated through holes 24.

FIG. 2 shows a top view of the related art semiconductor chip carrier 10. The dogbone connection pads 28 consume a large portion of the surface area on the carrier 10. This is because the interconnection contact area 34, the area upon which the interconnection is mounted, is offset from the plated through hole 24. As a result, the density of plated through holes 24 and interconnections for each carrier 10 is limited.

Additionally, due to differences in the coefficient of thermal expansion between the chip carrier, the chips and the interconnections therebetween, internal stresses develop within the semiconductor package during thermal cycling, which may eventually lead to device failure.

As a result, there exists a need in the industry for a more reliable, compact semiconductor device.

SUMMARY OF THE INVENTION

The present invention provides a more reliable semiconductor chip carrier, having high density plated through hole spacing and chip connections, and a method of forming the same.

The first general aspect of the present invention provides an interconnect structure comprising: a substrate; a plated through hole positioned within the substrate; a redistribution layer on a first and a second surface of the substrate; and a via within the redistribution layer, selectively positioned over and electrically connecting the plated through hole. This aspect allows for a semiconductor chip carrier having an increased plated through hole and chip connection density. This aspect provides vias, containing chip connection pads therein, positioned directly over the plated through holes, which eliminate the conventional dogbone construction. This aspect also provides additional wireout capabilities to take advantage of the increased plated through hole and chip connection density, namely, an additional pair of signal planes and an additional pair of power planes. This aspect also provides a redistribution layer which is made fatigue resistant due to the material choice, as well as locating the second pair of power planes directly underneath the redistribution layer. Due to the roughened surface of the second pair of power planes, the adhesion strength of the redistribution layer to the underlying substrate is increased. In addition, the second pair of power planes act as a redundant layer, preventing cracks originating within the redistribution layer from propagating through the carrier. Furthermore, this aspect provides for direct via connections, which eliminate the need for plated through holes.

A second general aspect of the present invention provides a method of forming a semiconductor chip carrier, comprising the steps of: providing a substrate, having a plated through hole therein; depositing a redistribution layer on a first and a second surface of the substrate; and forming a via within the redistribution layer, selectively positioned over and electrically contacting the plated through hole. This aspect provides a method of forming a semiconductor chip carrier having similar advantages as those associated with the first aspect.

A third general aspect of the present invention provides a semiconductor chip carrier comprising: a substrate having a plated through hole therein; and a fatigue resistant redistribution layer on a first and second surface of the substrate. This aspect provides similar advantages as those associated with the first aspect.

The foregoing and other features of the invention will be apparent from the following more particular description of the embodiments of the invention.

BRIEF DESCRIPTION OF THE DRAWINGS

Specific embodiments of this invention will be described in detail, with reference to the following figures, wherein like designations denote like elements, and wherein.

DESCRIPTION OF THE PREFERRED EMBODIMENTS

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of the embodiment. Although the drawings are intended to illustrate the present invention, the drawings are not necessarily drawn to scale.

Figure 3:
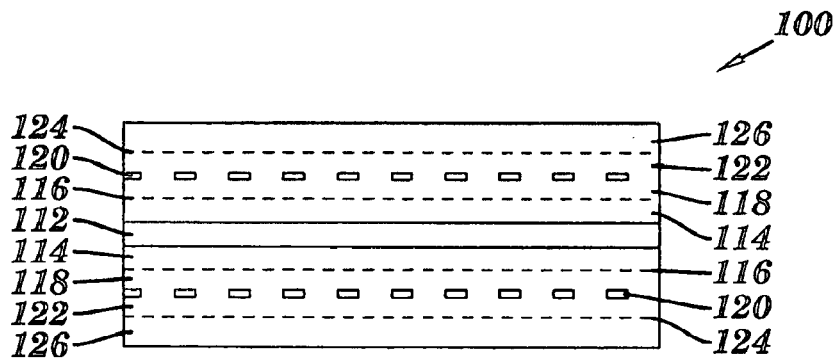
FIG. 3 depicts a cross-sectional view of a semiconductor chip carrier in accordance with a first embodiment of the present invention.

Referring to the drawings, FIG. 3 shows a substrate 100, including a ground plane 112, preferably comprising copper-Invar-copper (CIC). A first dielectric layer 114 is laminated to each side of the ground plane 112, using conventional lamination techniques. A pair of first controlled impedance signal planes 116 are formed, one over each of the first dielectric layers 114, using a conventional method known and used in the industry. The first signal planes 116 are preferably copper. A second dielectric layer 118 is formed over each of the first signal planes 116, using conventional lamination techniques. A pair of first power planes 120 are formed, one over each of the second dielectric layers 118, using conventional techniques. The first power planes 120 are preferably copper. A third dielectric layer 122 is laminated over each of the power planes 120. A pair of second controlled impedance signal planes 124 are formed, one over each of the third dielectric layers 122, using techniques similar to those used to form the first signal planes 116. The second signal planes 124 are preferably copper. A fourth dielectric layer 126 is laminated over each of the second signal planes 124, using conventional lamination techniques. In this example, the first, second, third and fourth dielectric layers 114, 118, 122, 126 comprise Rogers' 2300™ (Roger's Inc.). In particular, Rogers' 2300™ is a dielectric comprising a PTFE (polytetrafluroethylene) material filled with silicon particles. In the alternative, the first, second, third and fourth dielectric layers 114, 118, 122, 126 may be any other similar electronics laminate material, such as, epoxy resins, polyimide, polyphenylene ethers, etc.

Figure 4:
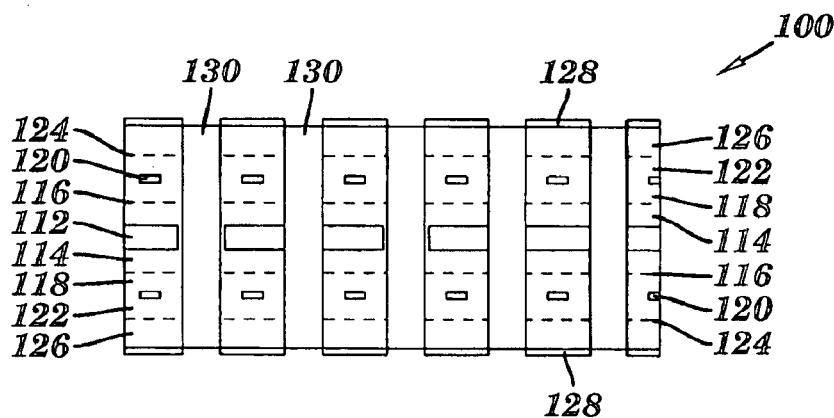
FIG. 4 depicts a cross-sectional view of the semiconductor chip carrier having through holes therein in accordance with a first embodiment of the present invention.

As shown in FIG. 4, a pair of second power planes 128 are laminated, one over each of the fourth dielectric layers 126 using conventional techniques. The surfaces of the second power planes 128 are etched to a thickness of approximately 2–9 microns, preferably using a fluid head etch process, to maintain a copper thickness suitable for laser drilling and electroplating an additional copper layer. It should be noted that the thickness of the second power planes 128, illustrated in the figures, is disproportionately large for the purpose of illustration only.

Figure 5:
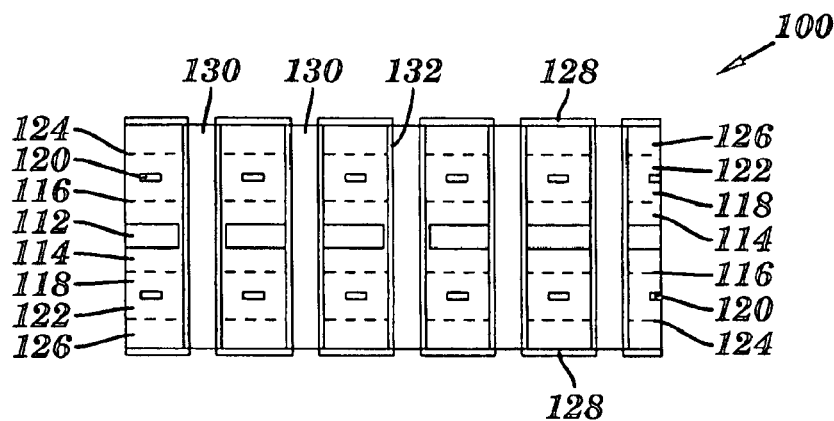
FIG. 5 depicts a cross-sectional view of the semiconductor chip carrier having plated through holes therein in accordance with a first embodiment of the present invention.

A plurality of through holes 130 are formed within the substrate 100, preferably using a laser drill process commonly used in the industry (FIG. 4). The through holes 130 are then cleaned to eliminate any debris which could prevent proper electrical connection. The surface of the second power planes 128 and the through holes 130 are then electroless plated with a conductive material, preferably copper. The through holes 130, and the second power planes 128 are then acid copper electroplated, forming plated through holes (PTH's) 132, as shown in FIG. 5. The thickness of the copper plating within the PTH's 132 is approximately 5–20 microns, while the composite copper thickness on the power planes 128 (composite thickness of the fluid head etched copper foil and subsequent acid copper electroplate) is approximately 7–29 microns.

Figure 6:
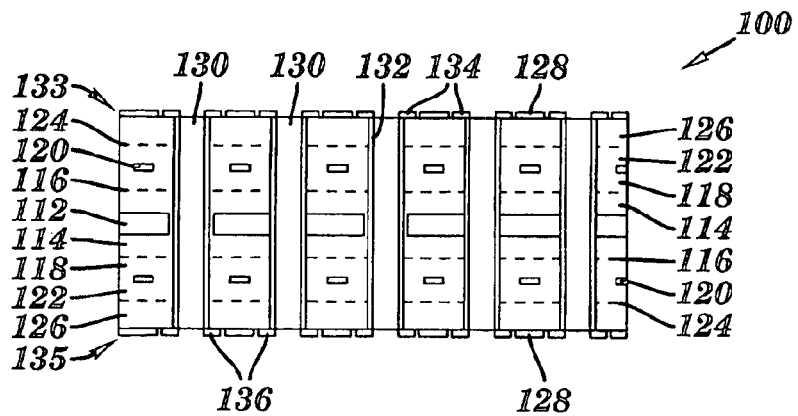
FIG. 6 depicts a cross-sectional view of the semiconductor chip carrier having a combined power core thereon in accordance with a first embodiment of the present invention.
Figure 7:
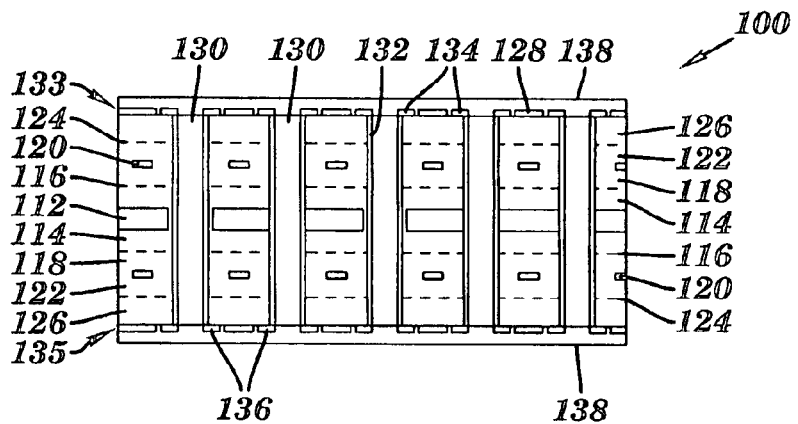
FIG. 7 depicts a cross-sectional view of the semiconductor chip carrier having a redistribution layer thereon in accordance with a first embodiment of the present invention.

As shown in FIG. 6, the power cores 128 are circuitized to electrically isolate the power cores 128 from the PTH pads 134, 136. The resultant surfaces are called the top surface metallurgy (TSM) 133 and the bottom surface metallurgy (BSM) 135. The TSM 133 and BSM 135 copper surfaces are preferably chlorited copper. Chlorited copper is copper that has been treated with chlorite to produce a roughened surface, thereby enhancing the adhesion strength of the redistribution layer (discussed infra). A redistribution layer 138 is then laminated over the TSM and BSM surfaces 133, 135 of the substrate 100, covering the power cores 128, and filling the PTH's 132, as shown in FIG. 7.

The redistribution layer 138 is preferably a dielectric material, such as Dynavia 2000™ (Shipley Ronal), polyimide, PSR-4000™ (Taiyo Ink Co. Ltd.), Vialux™ (DuPont), and other similar materials made by Arlon, Asahi Chemical, and other similar companies. The use of a flexible redistribution layer 138 tends to increase the overall flexibility of the substrate 100, thereby decreasing the internal stresses associated with thermal cycling.

Figure 8A:
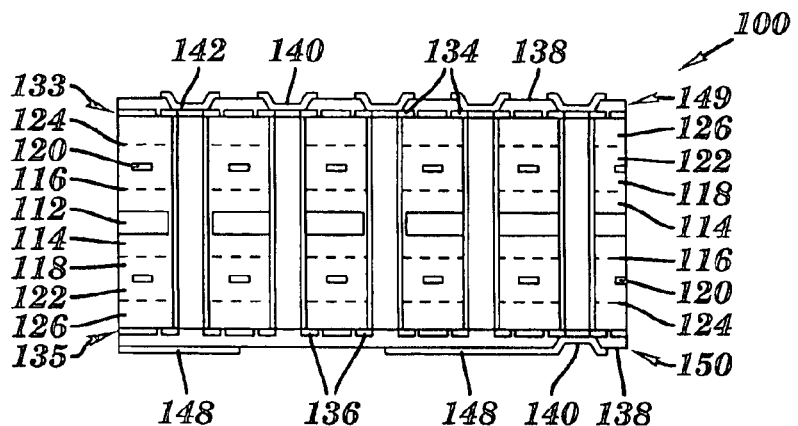
FIG. 8A depicts a cross-sectional view of the semiconductor chip carrier having connection pads thereon in accordance with a first embodiment of the present invention.
Figure 8B:
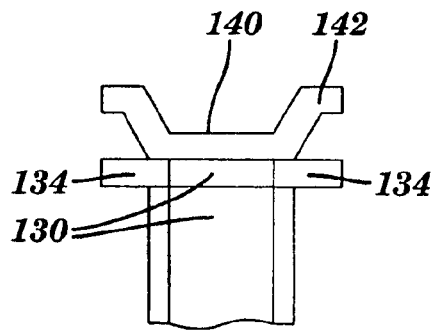
FIG. 8B depicts an enlarged cross-sectional view of a plated through hole having a connection pad thereon in accordance with a first embodiment of the present invention.
Figure 8C:
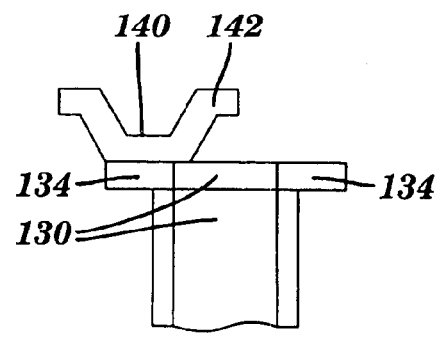
FIG. 8C depicts an enlarged cross-sectional view of a plated through hole having a connection pad thereon in accordance with an alternate embodiment of the present invention.

As shown in FIG. 8A, a plurality of blind vias or microvias 140 are laser drilled into the redistribution layer 138, directly over the PTH's 132. FIG. 8B shows an enlarged view of the placement of a microvia 140 with respect to the PTH 132, and particularly, the PTH pads 134. As illustrated, the microvias 140 may be placed directly over the PTH's 132. In the alternative, the microvias 140 may be drilled slightly off-set from the PTH's 132, as illustrated in FIG. 8C. In this case, the microvias 140 may extend partially into the through holes 130 of the PTH's 130, but typically should not extend beyond the PTH pads 134.

The microvias 140 are then cleaned of excess debris using known cleaning techniques. The microvias 140 are electroless plated with a conductive material, preferably copper, then acid copper plated to form chip connection pads 142. Typically, Controlled Collapse Chip Connector (C4) pads are formed through the redistribution layer 138 as part of and connected to the microvias 140 on the first surface 149 of the substrate 100. The Ball Grid Array (BGA) pads 148 (FIG. 8A) are formed on the second surface 150 of the substrate 100.

Figure 2:
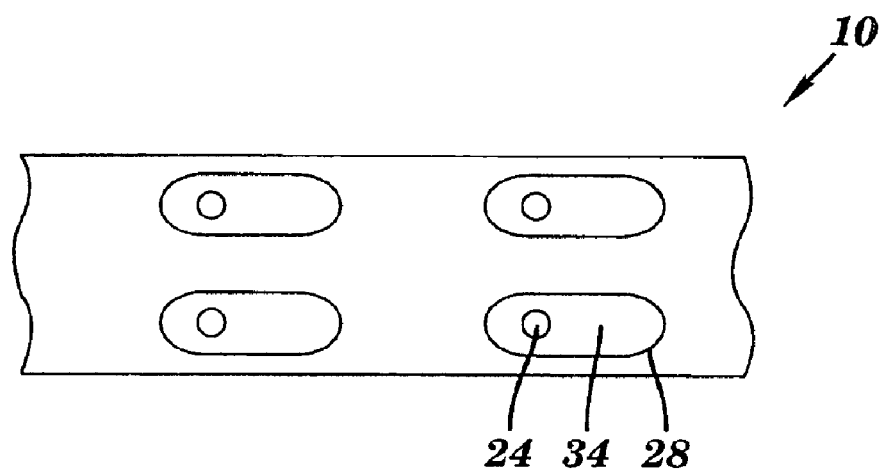
FIG. 2 depicts a top view of the related art semiconductor chip carrier.
Figure 9:
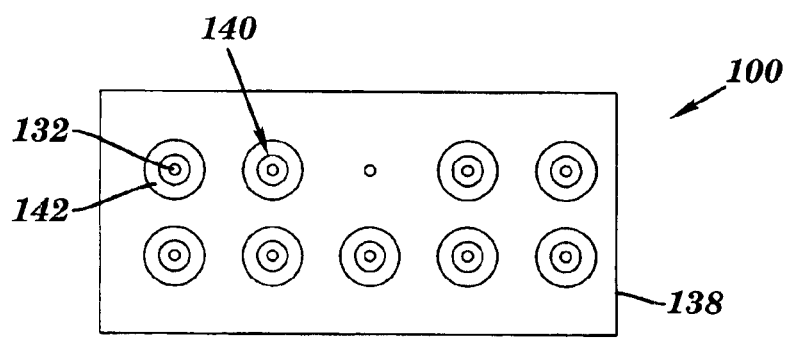
FIG. 9 depicts a top view of the semiconductor chip carrier in accordance with a first embodiment of the present invention.

FIG. 9 shows a top view of the substrate 100, having PTH's 132 therein. The vias 140 of the chip connection pads 142 may be formed directly over and in line with the PTH's 132, thereby allowing the semiconductor chips (not shown) to be mounted; directly over and physically contacting the PTH's 132. This construction eliminates the conventional dogbone construction, shown in related art FIG. 2. As a result, the density of the chip connection pads 142, as well as PTH's 132, may be increased. It should be understood that the configuration, quantity, size and arrangement of the PTH's 132 are used only as an example, and is in no way intended to limit the scope of the present invention.

It should be noted that the pair of second signal planes 124 and the pair of second power planes 128 provide additional "wireout" capabilities, to compensate for the increased density of PTH's 132 and chip connection pads 142. Heretofore, a single layer of "tri-plate" circuitry has been used. Tri-plate circuitry refers to a controlled impedance circuit consisting of a single ground, a pair of signal planes, and a pair of power planes, as illustrated in related art FIG. 1. The present invention, however, provides an additional pair of signal layers 124 and an additional pair of power planes 128. This increases the controlled impedance wireout capabilities of the substrate 100, thereby taking full advantage of the increased PTH 132 and chip connection pad 142 density. Layer thicknesses may be separately adjusted to obtain desirable electrical values.

Figure 1:
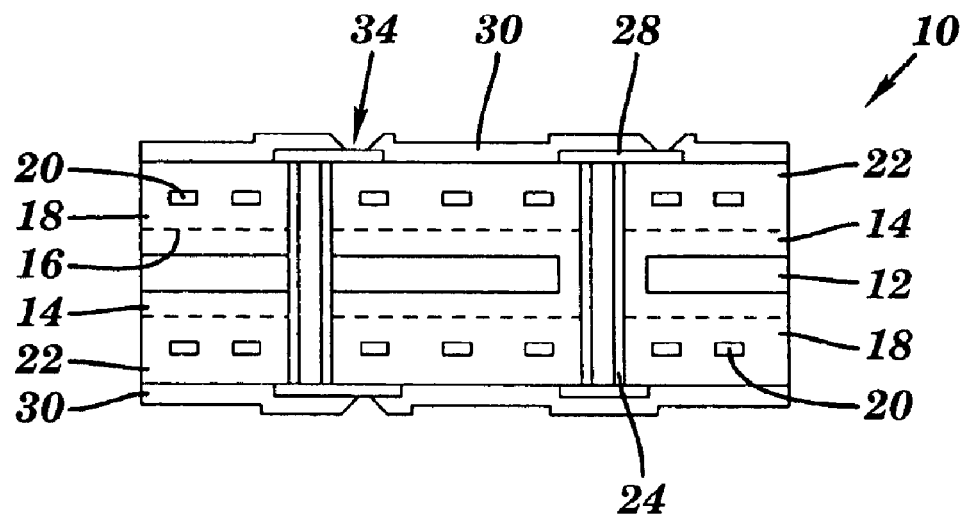
FIG. 1 depicts a cross-sectional view of a related art semiconductor chip carrier.
Figure 10:
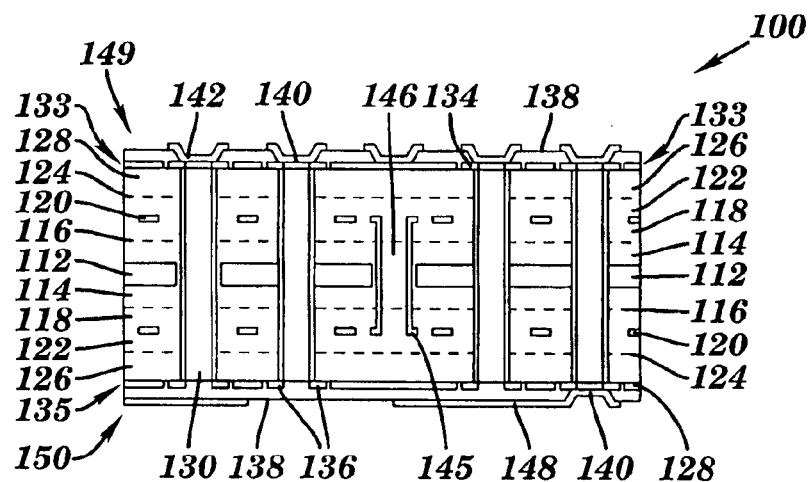
FIG. 10 depicts a cross-sectional view of the semiconductor chip carrier having a buried plated through hole therein in accordance with a second embodiment of the present invention.

It should be noted that the present invention eliminates the additional dielectric layer 22 conventionally used, which separated the redistribution layer 30 from the underlying power plane 16 (shown in related art FIG. 1). By eliminating this extra dielectric layer, the overall size of the carrier is reduced. In addition, elimination of the extra dielectric layer, in the present invention, allows for the application of the redistribution layer 138 directly onto the second pair of power planes 128, as shown in FIGS. 7, 8A and 10. This provides several benefits. For example, the roughened surfaces of the second power planes 128 enhance the adhesion strength of the redistribution layer 138 to the substrate 100. Placing the second power planes 128 directly underneath the redistribution layer 138 also controls strains imposed on the redistribution layer 138, thereby reducing the potential for fatigue cracks, and other stress related problems, during thermal cycling. In addition, the second power planes 128 moderate the effective coefficient of thermal expansion within the redistribution layer 138, thereby further reducing the potential for fatigue cracks within the redistribution layer 138. Further, the second power planes 128 are redundant layers. Fatigue cracks that originate within the redistribution layer 138 are not likely to propagate through the second power planes 128, thereby reducing the likelihood of device failure. The extent and amount of circuitry patterned as part of the second pair of power planes 128 and the power core 134 may be adjusted to provide a balance to copper pads 148, so warpage of the device is minimized.

In a second embodiment of the present invention, FIG. 10 shows a buried PTH 146 formed within the substrate 100. The buried PTH 146 is formed in a manner similar to the PTH's 132 described above. To form the buried PTH 146, however, the PTH formation process described above is performed before the outer layers of the substrate 100 are deposited. For example, after the lamination of the first power planes 120, the substrate 100 is laser drilled to form through hole 145. The through hole 145 and power planes 120 are then cleaned, electroless plated, preferably with copper, then acid copper electroplated, and circuitized to form the buried PTH 146. The third dielectric layer 122 is laminated over the first power planes 120, which also fills and covers the ends of the buried PTH 146. The process described above in association with the first embodiment may then be continued to form the remaining PTH's 132, if so desired. The buried PTH 146 provides the substrate 100 with enhanced internal electrical connection.

It should be noted that the buried PTH 146 described in the second embodiment may be used in conjunction with the PTH's 132 described in the first embodiment. In the alternative, the buried PTH 146 may have other applications, separate and distinct from the first embodiment. It should also be noted that formation of the buried PTH 146 described in the second embodiment is only meant to be an example, and is in no way intended to limit the scope of the present invention. For instance, more than one buried PTH 146 may be formed within a carrier. In addition, the buried PTH 146 is not limited to formation between the first power planes 120.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

We claim:

1. A method of forming a semiconductor chip carrier, comprising the steps of:

providing a substrate, having a plated through hole therein;

forming a first power plane on a first external surface of the substrate and in direct mechanical contact with the first external surface;

forming a second power plane on a second external surface of the substrate and in direct mechanical contact with the second external surface;

depositing a first redistribution layer on the first power plane and in direct mechanical contact with a surface of the first power plane, wherein the first power plane is disposed between the first redistribution layer and the first external surface;

depositing a second redistribution layer on the second power plane and in direct mechanical contact with the second power plane, wherein a surface of the second power plane is disposed between the second redistribution layer and the second external surface;

forming a first plated blind via the first redistribution layer, wherein the first via is in electrical contact with the plated through hole, and wherein the first via is in direct mechanical and electrical contact with first power plane; and forming a second plated blind via in the second redistribution layer, wherein the second via is in electrical contact with the plated through hole, and wherein the second via is in direct mechanical and electrical contact with the second power plane.

2. The method of claim 1, further including the step of:

forming a chip connection pad in the first via.

3. The method of claim 1, wherein the step of providing a substrate, having a plated through hole therein includes the steps of:

drilling a hole through the substrate;

cleaning tho hole; and forming a conductive layer on an interior surface of the hole.

4. The method of claim 1, further comprising the step of:

filling the plated through hole with a reinforcing material.

5. The method of claim 4, wherein the reinforcing material comprises an electrically conductive material.

6. The method of claim 1, wherein the step of providing a substrate, having a plated through hole therein further includes the steps of:

providing a ground plane;

forming a first pair of signal planes within the substrate;

forming a first pair of power cores within the substrate;

forming a second pair of signal planes within the substrate.

7. A method of forming a semiconductor chip carrier, comprising the steps of:
providing a substrate, having a plated through hole therein;
depositing a redistribution layer on a first and a second surface of the substrate; and
forming a via within the redistribution layer, selectively positioned over and electrically contacting the plated through hole, wherein the step of providing a substrate, having a plated through hole therein further includes the steps of:
providing a ground plane;
forming a first pair of signal planes within the substrate;
forming a first pair of power cores within the substrate;
forming a second pair of signal planes within the substrate; and
forming a second pair of power cores within the substrate, wherein the first and second pair of signal planes are controlled impedance circuitry.

8. A method or forming a semiconductor chip carrier, comprising the steps of:
providing a substrate, having a plated through hole therein;
depositing a redistribution layer on a first and a second surface of the substrate; and
forming a via within the redistribution layer, selectively positioned over and electrically contacting the plated through hole, wherein the step of providing a substrate, having a plated through hole therein further includes the steps of:
providing a ground plane;
forming a first pair of signal planes within the substrate;
forming a first pair of power cores within the substrate;
forming a second pair of signal planes within the substrate; and
forming a second pair of power cores within the substrate, wherein the second pair of power cores are directly underneath and electrically connected to portions of the redistribution layer.

9. The method of claim 1, wherein the first and second power planes respectively include a top surface metallurgy (TSM) and a bottom surface metallurgy (BSM).

10. The method of claim 1, wherein the first redistribution layer comprises a fatigue resistant dielectric material.

11. The method of claim 1, further comprising the step of:
providing a buried plated through hole in the substrate.

12. The method of claim 1, further comprising:
roughening the surface of the first power plane, thereby enhancing an adhesion of the first redistribution layer to the first power plane; and
roughening the surface of the second power plane, thereby enhancing an adhesion of the second redistribution layer to the second power plane.

13. The method of claim 12, wherein the first and second power planes each comprises copper, and wherein roughening the surface of the first and second power planes comprises treating the surface of the first and second power planes with chlorite.

14. The method of claim 1, wherein the first and second redistribution layers each comprise a dielectric material having a flexibility that reduces internal stresses resulting from thermal cycling of the substrate, the first and second power planes, and the first and second redistribution layers.

15. The method of claim 1, further comprising:
forming a Controlled Collapse Chip Connection (C4) pad through the first redistribution layer as part of and connected to the first via; and
forming a Ball Grid Array (BGA) pad directly on and connected to the second via.

16. The method of claim 1, wherein the first via is in selectively aligned directly over the plated through hole.

17. The method of claim 16, wherein the second via is aligned directly over the plated through hole.

18. The method of claim 16, wherein the second via is offset from the plated through hole.

19. The method of claim 1, wherein the first via is offset from the plated through hole.

20. The method of claim 19, wherein the second via is offset from the plated through hole.

* * * * *